United States Patent
Sasaki et al.

(10) Patent No.: US 7,430,125 B2
(45) Date of Patent: *Sep. 30, 2008

(54) DATA PROCESSING TERMINAL, PARENT BOARD, CHILD BOARD, TERMINAL DESIGNING APPARATUS AND METHOD, COMPUTER PROGRAM, AND INFORMATION STORAGE MEDIUM

(75) Inventors: Hideki Sasaki, Tokyo (JP); Toshihide Kuriyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/778,108

(22) Filed: Jul. 16, 2007

(65) Prior Publication Data

US 2007/0258222 A1 Nov. 8, 2007

Related U.S. Application Data

(62) Division of application No. 10/478,509, filed as application No. PCT/JP02/02230 on Mar. 11, 2002, now Pat. No. 7,268,739.

(30) Foreign Application Priority Data

May 23, 2001 (JP) .............................. 2001-153768

(51) Int. Cl.
*H05K 1/00* (2006.01)
(52) U.S. Cl. .................. 361/748; 361/780; 343/702; 343/848; 343/841; 174/51; 174/78
(58) Field of Classification Search ................ 343/846, 343/702, 848, 841; 174/51, 78; 361/748, 361/780; 455/90.3
See application file for complete search history.

(56) References Cited

U.S. PATENT DOCUMENTS

| 5,801,660 | A  | * | 9/1998 | Ohtsuka et al. ....... 343/700 MS |
| 5,889,497 | A  |   | 3/1999 | Brooker et al. |
| 6,184,833 | B1 |   | 2/2001 | Tran |
| 6,198,362 | B1 |   | 3/2001 | Harada et al. |
| 6,411,522 | B1 | * | 6/2002 | Frank et al. .................. 361/800 |
| 6,573,804 | B2 |   | 6/2003 | Hayashi |
| 6,603,077 | B2 |   | 8/2003 | Hirai |
| 6,985,111 | B2 |   | 1/2006 | Hara et al. |
| 7,002,529 | B2 |   | 2/2006 | Sasaki et al. |

(Continued)

FOREIGN PATENT DOCUMENTS

JP        7-98621        4/1995

(Continued)

*Primary Examiner*—Tuan Dinh
*Assistant Examiner*—Hoa C Nguyen
(74) *Attorney, Agent, or Firm*—Young & Thompson

(57) ABSTRACT

A second ground plane (18); has one end opposite to a connector (14), which end is connected to a first ground plane (17) by resistor connection element (41). Accordingly, it is possible to lower Q of resonance of the ground structure by the resistor connection element (41) and to prevent generation of an intense electromagnetic field attributed to an electromagnetic field of a data processing circuit. Especially when the resistor connection element (41) has a resistance value identical to a characteristic impedance of the ground structure, the ground structure is terminated in a matched way and it is possible to assure prevention of generation of an electromagnetic field attributed to resonance.

10 Claims, 11 Drawing Sheets

U.S. PATENT DOCUMENTS

| | | |
|---|---|---|
| 7,068,518 B2 | 6/2006 | Ueno et al. |
| 2002/0000939 A1 | 1/2002 | Kaiponen |
| 2002/0117318 A1 | 8/2002 | Suzuki |
| 2003/0048234 A1 | 3/2003 | Alexopoulos et al. |
| 2003/0098813 A1 | 5/2003 | Koskiniemi et al. |
| 2004/0246187 A1 * | 12/2004 | Hara et al. .................. 343/702 |

FOREIGN PATENT DOCUMENTS

| | | |
|---|---|---|
| JP | 11-54860 | 2/1999 |
| JP | 11-298183 | 10/1999 |
| JP | 2001-102949 | 4/2001 |
| JP | 2001-332825 | 11/2001 |

* cited by examiner

PRIOR ART

PRIOR ART

PRIOR ART

Fig. 19A
Fig. 19B
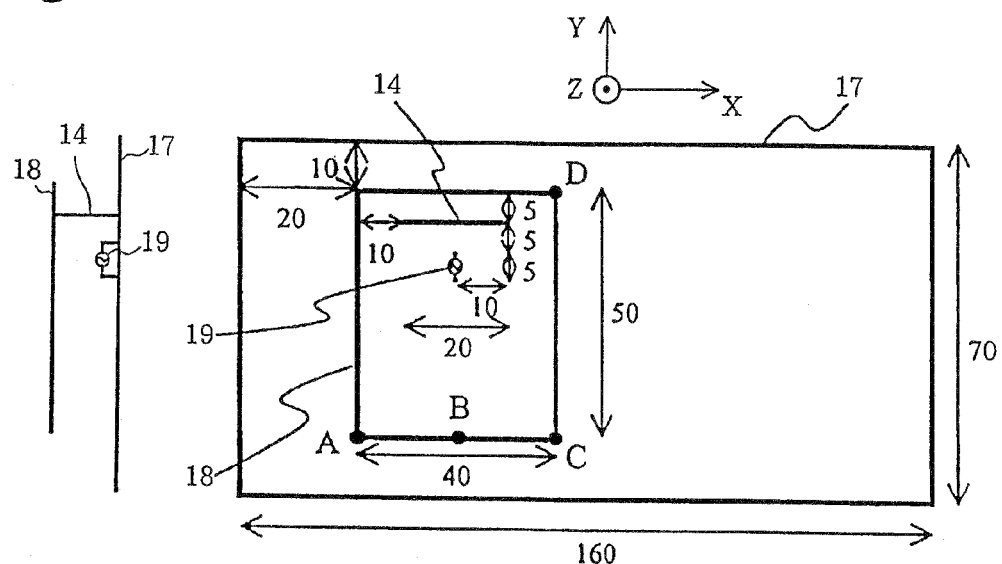
Fig. 20
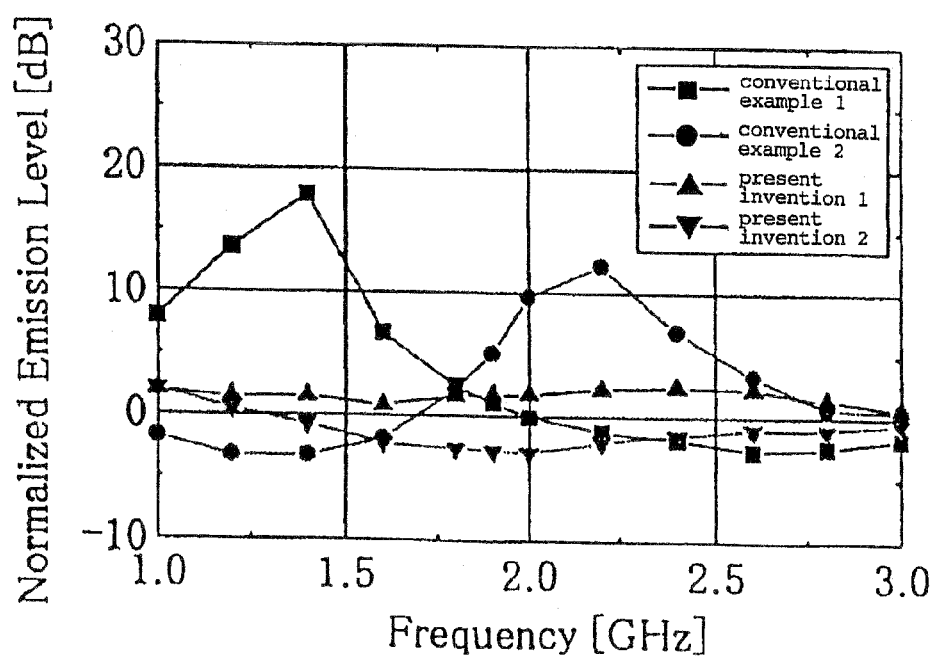

DATA PROCESSING TERMINAL, PARENT BOARD, CHILD BOARD, TERMINAL DESIGNING APPARATUS AND METHOD, COMPUTER PROGRAM, AND INFORMATION STORAGE MEDIUM

TECHNICAL FIELD

The present invention relates to a data processing terminal which comprises a first and a second ground plane, a parent board and a child board for the data processing terminal, a terminal designing apparatus and method for use in designing the data processing terminal, a computer program for the terminal designing apparatus, and an information storage medium having the computer program stored thereon.

BACKGROUND ART

At present, a variety of user terminal devices are pervasive. They can serve as PDA (Personal Digital Assistant) to support a variety of users, and communicate data processed thereby to the outside using a wireless communication function such as PHS (Personal Handy-phone System: a registered trademark). Now, a prior art example of such a data processing terminal will be described with reference to drawings.

FIG. 1 illustrates data processing terminal 10 as a first prior art example. Data processing terminal 10 comprises a hollow housing (not shown) which contains parent board 11, child board 15, and connector 14 for connecting both boards. Parent board 11 is mounted with a variety of data processing circuits (not shown) comprised of integrated circuits, while child board 15 is mounted with a memory circuit (not shown) such as RAM (Random Access Memory), flash memory and the like.

A card slot (not shown) is formed at one end of the housing, such that separate card-shaped radio communication unit 12 is removably plugged into the card slot. Radio communication unit 12 comprises a built-in radio communication circuit (not shown), and rod-like antenna 13 attached thereto.

Data processing terminal 10 has a user interface (not shown) such as a touch panel, a keyboard and the like on the surface of the housing, such that the data processing circuit on parent board 11 executes a variety of data processing in response to data entered through the user interface and the like.

In data processing terminal 10, as card-shaped radio communication unit 12 is plugged into the card slot of the housing, the radio communication circuit in radio communication unit 12 can be in wired communication with the data processing circuit on parent board 11, permitting data processing terminal to make radio communications in a frequency band near 1.9 (GHz) using a PHS function through radio communication unit 12.

In other words, data processing terminal 10 can make radio communications with the outside as required with the aid of radio communication unit 12 to transmit data processed by the data processing circuit over the air, as well as to process data received over the air with the aid of the data processing circuit. Further, when data processed by the data processing circuit is stored in the memory circuit on child board 15, data processing terminal 10 can process a large capacity of data.

In data processing terminal 10 as described above, parent board 11 is substantially entirely formed with a metal-made first ground plane, while child board 15 is likewise substantially entirely formed with a metal-made second ground plane (not shown), wherein both ground planes determine potential references for circuits on the respective boards.

Connector 14, which connects the two boards, has a plurality of signal terminals and a plurality of ground terminals arranged in parallel, wherein one ground terminal is inserted, for example, every three signal terminals. With such a structure, as child board 15 is mounted on parent board 11, data processing circuit on parent board 11 is connected to the memory circuit on child board 15 through the signal terminals of connector 14, and the first ground plane on parent board 11 is connected to the second ground plane on child board 15 through the ground terminals of connector 14 to connect the potential references provided by the ground planes on both boards.

While FIG. 1 illustrates data processing terminal 10 which has child board 15 mounted on parent board 11 through a pair of connectors 14 that are removable in the vertical direction, there is also a product, data processing terminal 20 illustrated in FIG. 2, which is a second prior art example, wherein child board 15 is mounted to and removed from connector 21 in the transverse direction.

Also, as data processing terminal 30 in FIG. 3, which is a third prior art example, there is a product which comprises connection pads 31, 32 formed on the front surface and back surface of parent board 11 and child board 15 and electrically connected to the first ground plane and second ground plane, respectively, with connection pads 31, 32 being electrically connected through tubular metal columns 34 and screws 35 which make up auxiliary connecting means 33. It should be noted that such metal columns 34 and screws 35 are generally intended to mechanically hold child board 15, so that they are disposed near a pair of corners at diagonal positions of child board 15.

In the aforementioned data processing terminal 10, 20, first ground plane 17 of parent board 11 and second ground plane 18 of child board 15 connected through connectors 14, 21 are positioned in parallel with each other, as illustrated in FIG. 4. Also, data processing circuit 19 composed of a multiplicity of electronic parts such as LSIs (Large Scale Integration) and signal wires is mounted on first ground plane 17 of parent board 11.

Since data processing circuit 19 transmits repetitive signals and non-repetitive signals at particular frequencies within the circuit when it processes data, an electromagnetic field is generated in the neighborhood, associated with frequency components and harmonic components of the transmitted signals. This electromagnetic field not only causes a high frequency current to flow into first ground plane 17 of parent board 11 but also induces a high frequency current into second ground plane 18 of child board 15 disposed in the neighborhood.

The inventors found that the ground structure comprised of first ground plane 17 of parent board 11, second ground plane 18 of child board 15, and the ground terminals of connectors 14 as illustrated in FIG. 4 well resembled an antenna element of a quarter wavelength resonant antenna referred to as an "inverted L-shaped antenna" or an "inverted F-shaped antenna", as illustrated in FIGS. 5A and 5B (reference: "Small Antennas" K. Fujimoto, A. Henderson and J. R. James, Research Studies Press, Chapter 2.4).

In thinking in the foregoing manner, from the fact that connector 14 comprises a plurality of ground terminals, second ground plane 18 of child board 15 has an edge close to connector 14 that corresponds to a short-circuited end of the antenna element, and an edge opposite to connector 14 that corresponds to an open end of the antenna element. If a current induced into second ground plane 18 from data processing circuit 19 includes frequency components which cause second ground plane 18 to generate quarter wavelength resonance, a strong electromagnetic field is generated around second ground plane 18, thereby irradiating strong electromagnetic waves a long way off.

When considering child board 15 that has a memory circuit mounted thereon, child board 15 generally has edges extending over approximately 25 to 75 (mm), so that the quarter wavelength resonance occurs at frequency in a range of approximately 1 to 3 (GHz).

Since conventional data processing circuit 19 internally transmits signals at a basic frequency around several MHz, its harmonics are also on the order of 100 (MHz) at most. Thus, data processing circuit 19 is free from the quarter wavelength resonance because harmonic components are largely lower than the frequency at which the quarter wavelength resonance occurs in the ground structure.

Recently, however, the trend of increasing the processing speed of integrated circuits has increased the basic frequency of data processing circuit 19 to several hundred MHz, and its harmonics have also spread to as high as several GHz. Since the harmonics overlap the frequency at which the aforementioned ground structure is at the quarter wavelength, the ground structure suffers from the resonance.

On the other hand, with the recent development of radio communications, GHz bands are increasingly utilized for radio communications, such as approximately 1.9 (GHz) in PHS; approximately 800 (MHz), approximately 1.5 (GHz), and approximately 2.0 (GHz) in portable telephones; and approximately 2.4 (GHz) in wireless LAN (Local Area Network) and Bluetooth.

From the foregoing background, the resonant frequency associated with the ground structure overlaps the frequency bands used for radio communications, giving rise to a problem that radio communications are impeded by the ground structure.

While it has been predicted from before that the electromagnetic field generated by data processing circuit 19 would directly affect radio communication unit 12, and countermeasures have been taken therefor, nobody has been able to predict that the operation of data processing circuit 19 on parent board 11 causes child board 15 and the like to act as a resonant antenna, and an electromagnetic field generated thereby affects radio communication unit 12.

As illustrated in FIG. 3, in data processing terminal 30 of the third prior art example, first and second ground planes 17, 18 are each short-circuited by auxiliary connecting means 33 at a corner near an open edge thereof, so that the ground structure in this prior art example is free from the quarter wavelength resonance, but can suffer from half wavelength resonance. Since the half wavelength resonance is induced at frequency on the order of 2-6 (GHz) with the aforementioned size, this range of frequencies, though slightly higher than the previous examples, will impede the communications as well because it is close to the frequency bands used for radio communications.

The description made in connection with the aforementioned data processing terminals 10, 20, 30 clarifies that radio communications made by removably connected radio communication unit 12 are impeded by the ground structure within the terminal. Such impeded radio communications will be experienced if radio communication unit 12 is disposed near the ground structure.

Therefore, communication failures can arise even if a radio communication circuit is connected to the data processing terminal through a connection cable, or when it is placed near the data processing terminal, though not connected thereto (not shown).

To solve the problem as mentioned above, child board 15 may be covered with a metal case (not shown), with the metal case being connected to first ground plane 17 of parent substrate 11, to isolate radio communication unit 12 from a strong electromagnetic field generated by child board 15. However, even with the structure using the metal case for fully covering child board 15, the metal case causes a problem of an increase in the size of data processing terminal 10, 20, 30.

DISCLOSURE OF THE INVENTION

The present invention has been made in view of the problems as mentioned above, and it is an object of the invention to provide a data processing terminal which reduces the generation of an electromagnetic field that impedes radio communications, a parent board and a child board for use in the data processing terminal, a terminal designing apparatus and method for use in designing the data processing terminal, a computer program for designing the terminal designing apparatus, and an information storage device having the computer program stored thereon.

A first data processing terminal according to the present invention comprises a first ground plane, a second ground plane, a data processing circuit, a connector, and resistive connecting means. The first ground plane is comprised of a conductor in a predetermined shape, and determines a potential reference. The second ground plane is comprised of a conductor in a predetermined shape which includes at least a plurality of edges, and is positioned substantially in parallel with the first ground plane. The data processing circuit is connected to at least one of the first ground plane and second ground plane for executing data processing. The connector includes at least a plurality of ground terminals, and connects the second ground plane to the first ground plane at a position near one edge of the second ground plane. The resistive connecting means is formed to generate a predetermined resistance value, and connects a position near the other edge of the second ground plane opposite to the position of the connector to the first ground plane. Consequently, the predetermined resistance value exists at an open end of a ground structure comprised of the first ground plane, the plurality of ground terminals, and the second ground plane, resulting in reduced Q of the resonance of the ground structure.

In another aspect of the present invention, the ground structure comprised of the first ground plane, the plurality of ground terminal, and the second ground plane has a characteristic impedance equivalent to the resistance value of the resistive connecting means, so that the open end of the ground structure is terminated in an impedance matched state.

Also, the resistive connecting means has a resistance value "R" which satisfies:

$$[\alpha 1 \times 120 \times \pi \times h/w] = R < [\alpha 2 \times 120 \times \pi \times h/w] \; (\Omega)$$

where "w" represents the length of the edge of the second ground plane near which the resistive connecting means is positioned, "h" represents the spacing between the first ground plane and the second ground plane, and $\alpha 1$ and $\alpha 2$ are predetermined coefficients which satisfy "$\alpha 1 = 1 = \alpha 2$, so that the characteristic impedance of the ground structure is equivalent to the resistance value of the resistive connecting means.

The resistive connecting means has the resistance value "R" which satisfies:

$$R = 120 \times \pi \times h/w \; (\Omega)$$

so that the characteristic impedance of the ground structure is identical to the resistance value of the resistive connecting means.

Alternatively, the resistive connecting means comprises n resistive connecting means for connecting the first ground plane to the second ground plane in parallel, and each of the n resistive connecting means has a resistance value "R" which satisfies:

$$R=120\times\pi\times h/w \ (\Omega)$$

so that the resistance value of the plurality of resistive connecting means is identical to the characteristic impedance of the ground structure, and reduced characteristic impedance exists in series of each resistive connecting means because there are a plurality of resistive connecting means.

Also, one of the resistive connecting means connects a position near the center of the edge of the second ground plane to the first ground plane, so that the second ground plane is connected to the first ground plane by the one resistive connecting means in a symmetric state.

Alternatively, two of the resistive connecting means connect positions near both ends of the edge of the second ground plane to the first ground plane, respectively, so that the second ground plane is connected to the first ground plane by the two resistive connecting means in a symmetric state.

Alternatively, three of the resistive connecting means connect positions near the center and both ends of the edge of the second ground plane to the first ground plane, respectively, so that the second ground plane is connected to the first ground plane by the three resistive connecting means in a symmetric state.

Further alternatively, the resistive connecting means is formed in an elongated shape having an overall length equivalent to the edge of the second ground plane, and the resistive connecting means is positioned substantially in parallel with the edge of the second ground plane, so that the entire edge of the second ground plane is connected to the first ground plane by the single resistive connecting means.

The first ground plane is formed on a parent board which has the data processing circuit mounted thereon, the second ground plane is formed on a child board mounted which has a memory circuit mounted thereon for temporarily storing data processed by the data processing circuit, the resistive connecting means comprises a resistor mounted on the parent board and connected to the first ground plane, and the resistor on the parent board is connected to the second ground plane on the child board through a conductor. Since the resistor required for the resistive connecting means is mounted on the parent board, the child board has the same structure as before.

Alternatively, the first ground plane is formed on a parent board which has the data processing circuit mounted thereon, the second ground plane is formed on a child board which has a memory circuit mounted thereon for temporarily storing data processed by the data processing circuit, the resistive connecting means comprises a resistor mounted on the child board and connected to the second ground plane, and the resistor on the child board is connected to the first ground plane on the parent board through a conductor. Since the resistor required for the resistive connecting means is mounted on the child board, the parent board has the same structure as before.

Alternatively, the first ground plane is formed on a parent board which has the data processing circuit mounted thereon, the second ground plane is formed on a child board which has a memory circuit mounted thereon for temporarily storing data processed by the data processing circuit, the resistive connecting means comprises two resistors mounted on the parent board and child board, respectively, and connected to the first ground plane and the second ground plane, respectively, and the resistors on the parent board and child board are connected to each other through a conductor. Since the resistive connecting means comprises two resistors, each resistive connecting means has the resistance value reduced to one-half.

Also, a radio communication circuit is removably mounted for making radio communications with the outside, wherein the radio communication circuit is in wired communication with the data processing circuit, so that even if the radio communication circuit in wired communication with the data processing circuit makes radio communications, the ground structure will not generate an electromagnetic field, by the action of resonance, which impedes the radio communications.

Alternatively, a radio communication circuit is formed integrally with the data processing terminal for making radio communications with the outside, wherein the radio communication circuit is in wired communication with the data processing circuit, so that even if radio communication circuit in wired communication with the data processing circuit makes radio communications, the ground structure will not generate an electromagnetic field, by the action of resonance, which impedes the radio communications.

A terminal designing apparatus according to the present invention comprises length input means, length storing means, spacing input means, spacing storing means, and resistance calculating means for use in designing the data processing terminal of the present invention. In a terminal designing method associated therewith, as the length input means receives the length "w" of a distal edge of the second ground plane opposite to the position of the connector, length storing means stores the entered length "w". As the spacing input means receives the spacing "h" between the first ground plane and second ground plane, the spacing storing means stores the entered spacing "h". Then, the resistance calculating means calculates the resistance value "R" of the resistive connecting means for connecting a position near the distal edge of the second ground plane opposite to the position of the connector to the first ground plane in accordance with "$R=120\times\pi\times h/w \ (\Omega)$". Thus, the resistance value is calculated for the resistive connecting means which terminates the open end of the ground structure in the data processing terminal in an impedance matched state.

The predetermined shape as referred to in the present invention may be any shape that comprises a plurality of edges and a plurality of corners, and contemplates, for example, a rectangular shape which has four edges and four corners, and the like. Also, a variety of means as referred to in the present invention may be formed to implement functions associated therewith, and contemplate, for example, dedicated hardware for performing predetermined functions, a computing device provided with predetermined functions by a computer program, predetermined functions implemented within a computing device by a computer program, a combination of them, and the like. Also, a variety of means as referred to in the present invention need not be individually independent existence, but contemplate a certain means which forms part of another means.

The information storage medium as referred to in the present invention may be hardware which has a computer program previously stored therein for causing a terminal designing apparatus to execute a variety of processing, and contemplates, for example, ROM (Read Only Memory) and/or HDD (Hard Disc Drive) resident in an apparatus which comprises the terminal designing apparatus, CD (Compact Disc)-ROM and/or FD (Floppy Disc) exchangeably loaded into the apparatus which comprises the terminal designing apparatus, and the like.

Also, the terminal designing apparatus as referred to in the present invention may be any hardware that can read a computer program to execute corresponding processing operations, and contemplates, for example, hardware which is mainly based on a CPU (Central Processing Unit) connected to a variety of devices such as ROM, RAM, I/F (Interface) unit, and the like.

In the present invention, causing the terminal designing apparatus to execute a variety of operations in accordance with a computer program also contemplates causing the terminal designing apparatus to control the operation of various devices. For example, storage of a variety of data in the terminal designing apparatus contemplates storing a variety of data in an information storage medium such as RAM which is contained in the terminal designing apparatus as its part, storing a variety of data in an information storage medium such as FD which is exchangeably loaded into the terminal designing apparatus, and the like.

BRIEF DESCRIPTION OF THE DRAWINGS

FIG. 7 is a schematic diagram illustrating electric features such as a first ground plane, a second ground plane and, the like;

FIG. 19A is a schematic diagram illustrating an electromagnetic simulation model;

FIG. 19B is a schematic diagram illustrating an electromagnetic simulation model; and FIG. 20 is a characteristic diagram showing the frequency characteristic of distant radiation electric field strength.

BEST MODE FOR CARRYING OUT THE INVENTION

Figure 1:
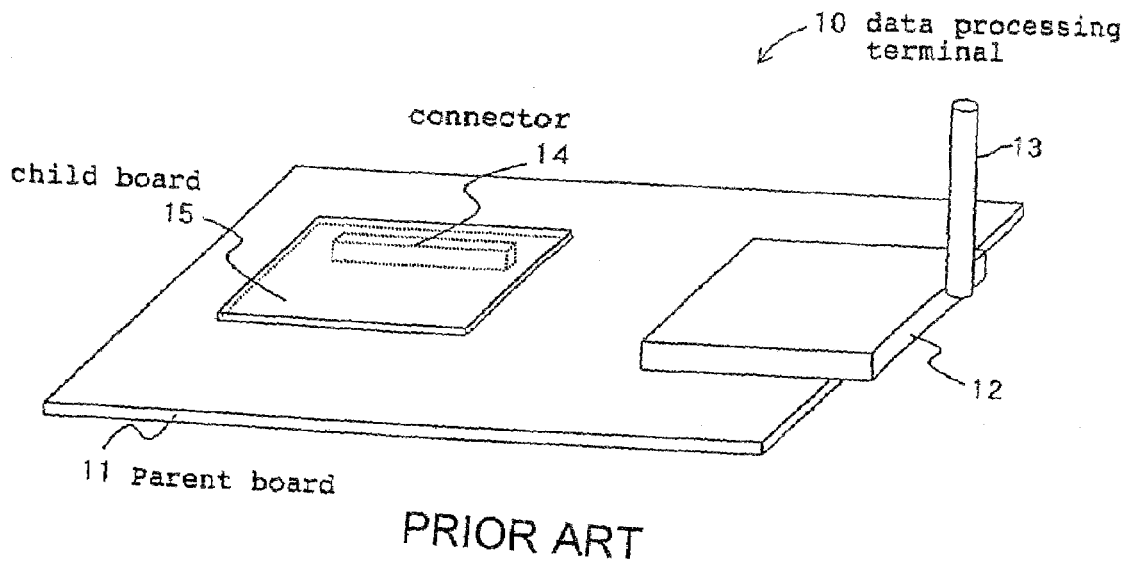
FIG. 1 is a perspective view illustrating the internal structure of a first exemplary conventional data processing terminal.

A first embodiment of the present invention will hereinafter be described with reference to FIGS. 6 to 10. However, parts in the following embodiments identical to those in the aforementioned prior art examples are designated the same names and reference numerals, and detailed description thereon will be omitted.

Figure 6:
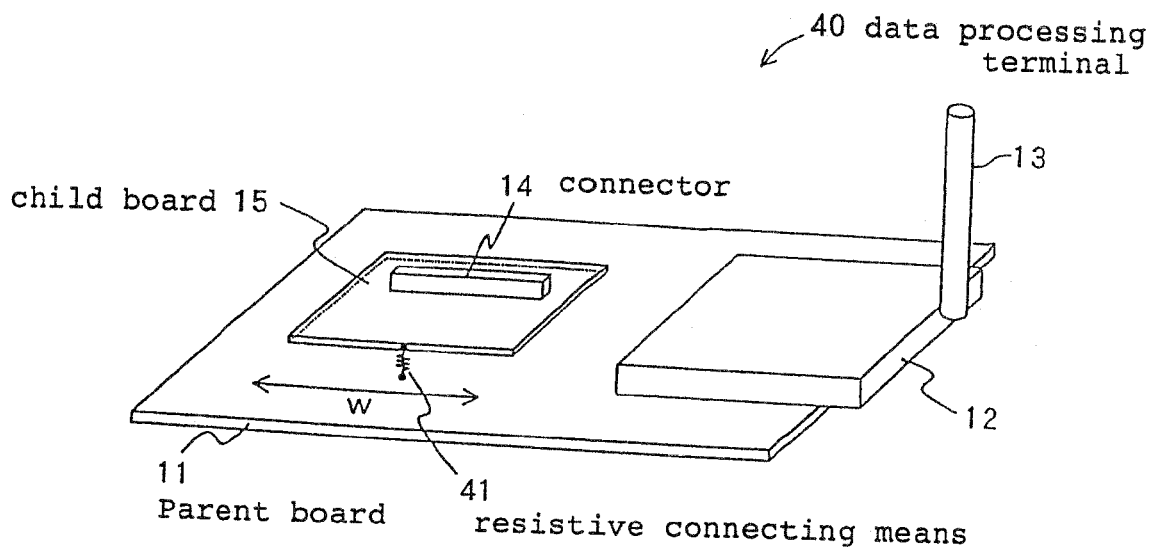
FIG. 6 is a perspective view illustrating the internal structure of a data processing terminal according to a first embodiment of the present invention.
Figure 7:
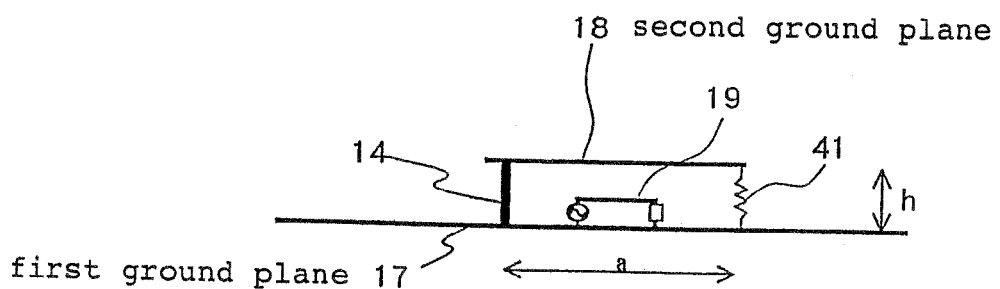

First, as illustrated in FIGS. 6 and 7, data processing terminal 40 according to the first embodiment comprises a variety of data processing circuits 19 mounted on large rectangular parent board 11 in a manner similar to data processing terminals 10, 20, 30 previously described as the first to the third prior art examples. Radio communication unit 12, which is in wired communication with data processing circuit 19, communicates with the outside over the air in a frequency band near 1.9 (GHz).

Parent board 11 comprises smaller rectangular child board 15 removably mounted thereon by connector 14, and second ground plane 18 of child board 15 is connected to first ground plane 17 of parent board 11 through connector 14.

First ground plane 17 and second ground plane 18 thus electrically and mechanically connected through connector 14 and placed in parallel with each other are further electrically connected through resistive connecting means 41. In resistive connecting means 41, connection pads 31, 32 of parent board 11/child boards 15, which are electrically continuous to first ground plane 17/second ground plane 18, are in electrical communication through tubular metal columns and screws (not shown) made, for example, of a resistive material.

Also, in data processing terminal 40 of this embodiment, though connector 14 is positioned near one longer side of rectangular child board 15 in parallel therewith, it differs from the aforementioned data processing terminal 30 and the like in that point-like resistive connecting means 41 is positioned near the center of the other longer side of child board 15.

Then, in data processing terminal 40 of this embodiment, resistance value "R" of resistive connecting means 41 satisfies "R=120×π×h/w (Ω)", where "w" represents the length of an edge of second ground plane 18 near which resistive connecting means 41 is positioned, and "h" represents the spacing between first ground plane 17 and second ground plane 18.

Consequently, in data processing terminal 40 of this embodiment, the ground structure comprised of first ground plane 17, a plurality of ground terminals, and second ground plane 18 has a characteristic impedance identical to the resistance value of resistive connecting means 41, thus achieving impedance matching at an open end of the terminated ground structure.

In data processing terminal 40 of this embodiment, when one end of connector 14 is positioned near a corner of second ground plane 18 as mentioned above, this position is approximated to the corner of second ground plane 18, and when resistive connecting means 41 is positioned near an edge of second ground plane 18, this position is approximated to the edge of second ground plane 18.

With the configuration as described above, in data processing terminal 40 of this embodiment, data processing circuit 19 on parent board 11 executes data processing to generate an electromagnetic field when radio communication unit 12 makes a radio communication, so that the electromagnetic field acts on the ground structure which has first and second ground planes 17, 18 connected through ground terminals of connector 14.

However, second ground plane 18 is connected to first ground plane 17 through resistive connecting means 41 at the center of an edge thereof which is an open end of the ground structure, and resistive connecting means 41 has a resistance value identical to the characteristic impedance of the ground structure.

Thus, the ground structure has the open end terminated in an impedance matched state, so that even if the electromagnetic field of data processing circuit 19 acts on the ground structure, this will not lead to the generation of a strong electromagnetic field, by the action of resonance, which would impede radio communications. Consequently, data processing terminal 40 of this embodiment can prevent impeded radio communications of radio communication unit 12 to satisfactorily carry out radio communications.

Moreover, in data processing terminal 40 of this embodiment, connector 14 is identical in position and structure to the prior art with the addition of single extra resistive connecting means 41, so that it is also simple in structure and easy to assemble. Further, since resistive connecting means 41 is positioned near the center of the distal longer side of child board 15 from connector 14, second ground plane 18 can be satisfactorily connected to first ground plane 17 in a symmetric state if resistive connecting means 41 mechanically holds child board 15 as well.

Figure 8:
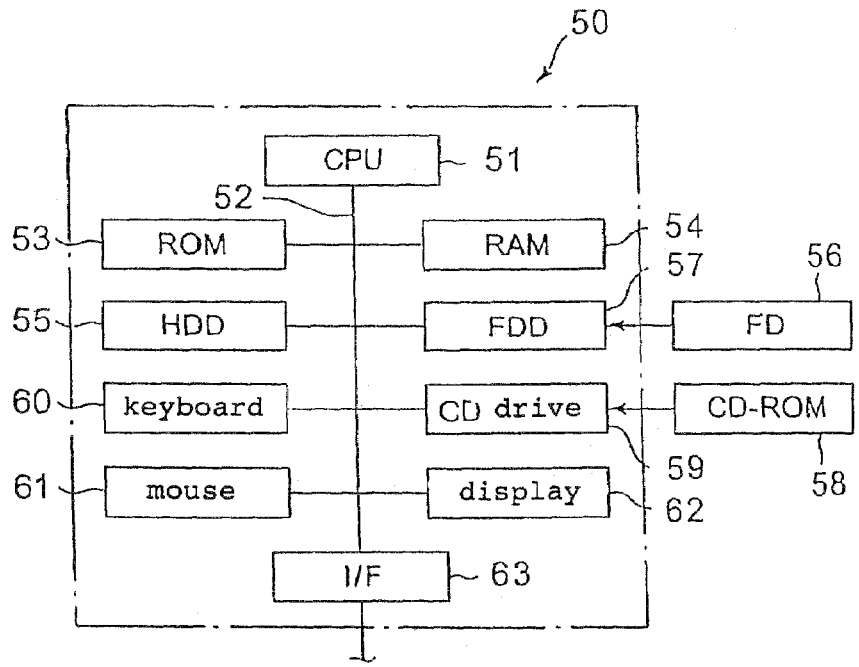
FIG. 8 is a block diagram illustrating the physical structure of a terminal designing apparatus according to the first embodiment of the present invention.

Now, the following description will be made on terminal designing apparatus 50 in this embodiment which is utilized for designing data processing terminal 40 in the structure as described above. As illustrated in FIG. 8, terminal designing apparatus 50 of this embodiment comprises CPU 51 which serves as main hardware of a computer. CPU 51 is connected through bus line 52 to hardware such as ROM 53; RAM 54; HDD 55; FDD (FD Drive) 57 which is exchangeably loaded with FD 56; CD drive 59 which is exchangeably loaded with CD-ROM 58; keyboard 60; mouse 61; display 62; I/F unit 63, and the like.

In terminal designing apparatus 50 of this embodiment, hardware such as ROM 53, RAM 54, HDD 55, exchangeable FD 56, exchangeable CD-ROM 58, and the like corresponds to information storage media, and computer programs for CPU 51 and a variety of data are stored in at least one of them as software.

For example, a computer program which causes CPU 51 to execute a variety of processing operations has been previously stored on FD 56 or CD-ROM 58. Such software has been previously installed in HDD 55, and is copied to RAM 54 upon start of terminal designing apparatus 50, and read by CPU 51.

Figure 9:
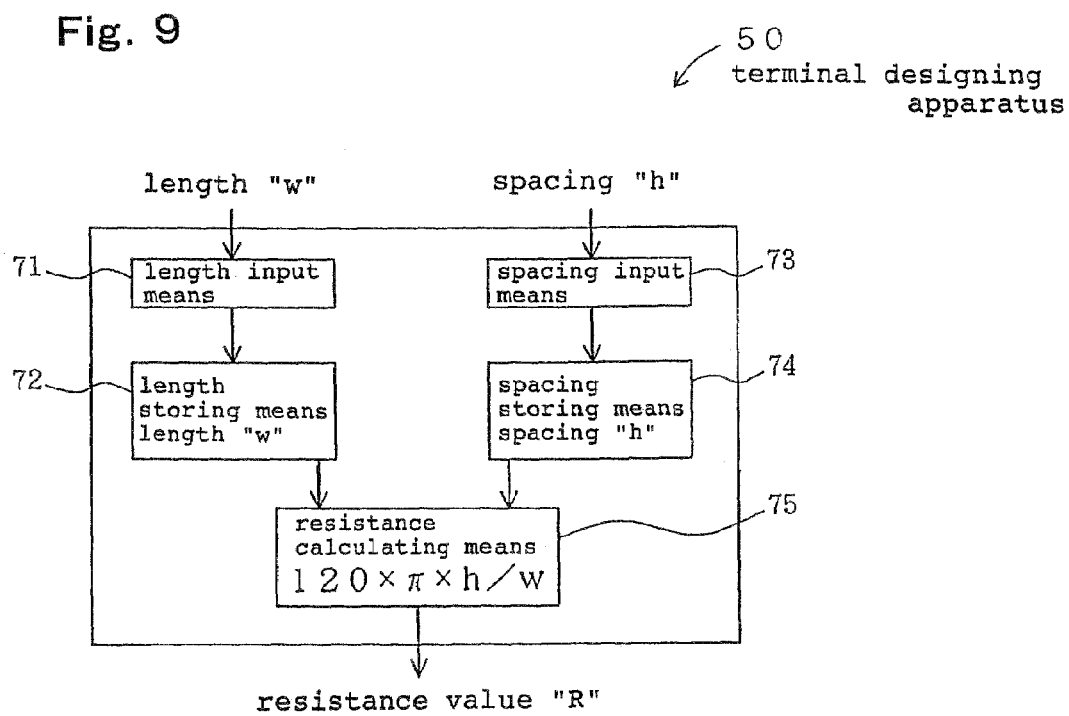
FIG. 9 is a schematic diagram illustrating the logical structure of the terminal designing apparatus.

As CPU 51 reads a proper computer program to execute a variety of processing operations, terminal designing apparatus 50 of this embodiment logically comprises a variety of means such as length input means 71, length storing means 72, spacing input means 73, spacing storing means 74, resistance calculating means 75, and the like, as illustrated in FIG. 9.

Each of input means 71, 73 corresponds to a function of CPU 51 for recognizing data entered through keyboard 60 in accordance with a computer program stored in RAM 54, while each of storing means 72, 74 corresponds to a storage area or the like reserved in HDD 55 in order for CPU 51 to recognize data in accordance with the computer program.

Length input means 71 receives length "w" of the other edge of second ground plane 18 opposing the position of connector 14, and length storing means 72 stores length "w" entered into length input means 71. Spacing input means 73 receives spacing "h" between first ground plane 17 and second ground plane 18, and spacing storing means 74 stores spacing "h" entered into spacing input means 73.

Then, resistance calculating means 75, which corresponds to a function of CPU 51 for executing predetermined data processing and the like in accordance with a computer program, calculates resistance value "R" of resistive connecting means 41 as "R=120×π×h/w (Ω)" based on the data stored in respective storing means 72, 74.

While a variety of means as mentioned above are implemented as required by hardware such as keyboard 60, display 62, and the like, their nucleuses are implemented by CPU 51, hardware of terminal designing apparatus 50, which functions in accordance with software stored in an information storage medium such as RAM 54 and the like.

Such software is stored in an information storage medius such as RAM 54 or the like as a computer program for causing CPU 51 and the like to execute such processing operations as length input processing for receiving length "w" entered through keyboard 60 or the like; length storage processing for storing the entered length "w" in HDD 55 or the like; spacing input processing for receiving entered spacing "h"; spacing storage processing for storing entered spacing "h"; resistance calculation processing for calculating resistance value "R" of resistive connecting means 41 as "R=120×π×h/w (Ω)"; and the like.

In data processing terminal 40 of this embodiment configured as described above, radio communication unit 12 in wired communication with data processing circuit 19 can communicate with the outside over the air. In this event, a high frequency electromagnetic field generated by data processing circuit 19 acts on the ground structure comprised of first ground plane 17, connector 14, and second ground plan 18.

However, in data processing terminal 40 of this embodiment, second ground plane 18 has an edge, distal from connector 14, connected to first ground plane 17 through resistive connecting means 41, and resistive connecting means 41 has a resistance value which matches with the characteristic impedance of the ground structure.

Thus, the ground structure has an open end terminated in impedance matched state, and therefore will not resonate with the acting high frequency electromagnetic field from data processing circuit 19 to generate a strong electromagnetic field which would impede radio communications of radio communication unit 12. Consequently, in data processing terminal 40 of this embodiment, radio communication unit 12 can satisfactorily carry out radio communications.

Now, the following description will be made on a terminal designing method associated with terminal designing apparatus 50 for use in designing such data processing terminal 40. Terminal designing apparatus 50 of this embodiment can calculate the resistance value of resistive connecting means 41 in data processing terminal for which length "w" of second ground plane 18, and spacing "h" between first ground plane 17 and second ground plane 18 have been determined.

Figure 10:
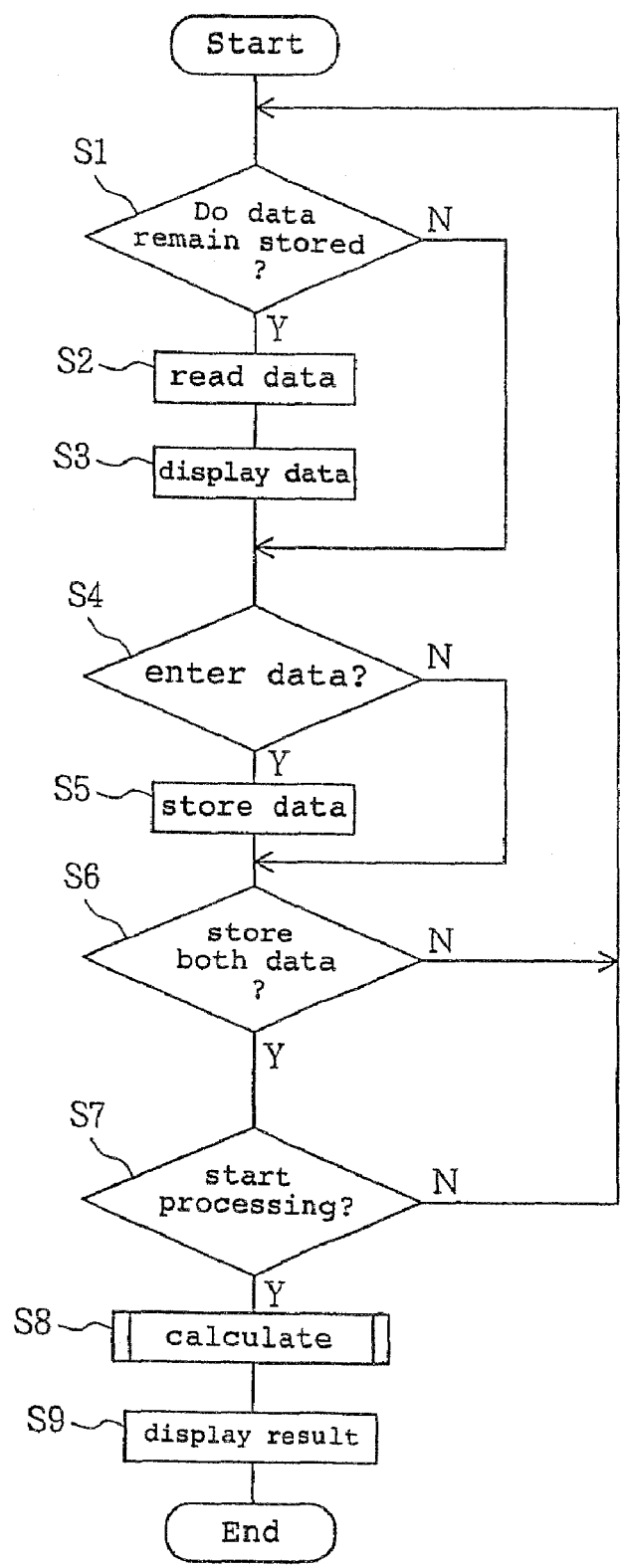
FIG. 10 is a flow chart illustrating a terminal designing method associated with the terminal designing apparatus.

In this event, as illustrated in FIG. 10, terminal designing apparatus 50 displays on display 62 a guidance text such as "enter the following data" together with items to be entered such as "length w=(mm), spacing h=(mm)" (step S3).

Thus, as an operator (not shown) who designs data processing terminal 40 enters desired numerical data for the aforementioned items to be entered through keyboard 60 or the like (step S4), terminal designing apparatus 50 stores the entered numerical data (step S5).

The numerical data thus entered are displayed at respective positions of the items to be entered. When numerical data have been previously entered and remain stored (step S1), the numerical data are displayed at the positions of associated items to be entered as changeable default values (steps S2, S3).

Then, as terminal designing apparatus 50 of this embodiment receives an instruction to start the processing after both of length "w" and spacing "h" have been stored in the associated storing means (steps S6, S7), terminal designing apparatus 50 calculates resistance value "R" of resistive connecting means 41 as "R=120×π×h/w (Ω)" based on the stored data (step S8).

Since resistance value "R" of resistive connecting means 41 thus calculated is displayed on display 62 (step S9), the operator can connect first and second ground planes 17, 18 of data processing terminal 40 to be manufactured with resistive connecting means 41 having resistance value "R".

It should be noted that the present invention is not limited to the foregoing embodiment, but contemplates a variety of modifications without departing from the gist thereof. For example, while the foregoing embodiment has illustrated that terminal designing apparatus 50 provides resistance value "R" in response to length "w" and spacing "h" entered thereinto, terminal designing apparatus 50 may declare whether or not "R=120×π×h/w (Ω)" is established in response to length "w" and spacing "h" entered thereinto.

Also, terminal designing apparatus 50 in the foregoing embodiment has illustrated that a variety of means are logically implemented as a variety of functions of terminal designing apparatus 50 by CPU 51 which operates in accordance with computer programs stored in RAM 54 and the like. However, each of a variety of such means can be formed as dedicated hardware, or some can be stored in RAM 54 and the like as software while some is formed as hardware.

Further, while the foregoing embodiment has illustrated that resistance value "R" of resistive connecting means 41 in data processing terminal 40 satisfies "R=120×π×h/w (Ω)", predetermined coefficient α1, α2 which satisfy "α1=1=α2", for example, may be used to provide resistance value "R" of resistive connecting means 41 which falls under the following range:

$$[α1×120×π×h/w] = R < [α2×120×π×h/w]$$

Even in this event, since the characteristic impedance of the ground structure in data processing terminal 40 is equivalent, not completely identical, to the resistance value of resistive connecting means 41, it is possible to prevent the generation of a strong electromagnetic field which impedes radio communications. Even if the resistance value of resistive connecting means 41 is not equivalent to the characteristic impedance of the ground structure in data processing terminal 40, a predetermined resistance value can contribute to a reduction in Q of resonance of the ground structure, so that a resulting electromagnetic field can be reduced.

Also, while the foregoing embodiment has illustrated that radio communication unit 12 is removably mounted in data processing terminal 40, radio communication unit 12 can be integrally secured thereon, radio communication unit 12 can be connected through a connection cable (not shown), or separate radio communication unit 12 can be used in the neighborhood without being connected thereto, by way of example.

Likewise, while the foregoing embodiment has illustrated that child board 15 is removably mounted on parent board 11, this can be integrally secured thereon. Also, while the foregoing embodiment has illustrated that child board 15 and radio communication unit 12 are disposed on the same side of parent board 11, child board 15 can be positioned on the frond side of parent board 11, while radio communication unit 12 can be positioned on the back side of parent board 11, by way of example.

Further, while data processing terminal 40 in the foregoing embodiment has illustrated that data processing circuit 19 is mounted on parent board 11 to which child board 15 is connected, data processing circuit 19 can be mounted only on child board 15, or can be distributively mounted on both parent board 11 and child board 15.

When data processing circuit 19 is mounted only on child board 15 as mentioned above, parent board 11 is not needed as a circuit board, so that first ground plane 17, which has a large area and a large capacity, is preferably formed as a dedicated ground member separate from the circuit board.

Also, while the foregoing embodiment has illustrated that data processing terminal 40 is formed for portable applications, this can also be formed for stationary applications. Also, while the foregoing embodiment has illustrated that the communication frequency of radio communication unit 12 is near 1.9 (GHz) for PHS, this can be near 800 (MHz), 1.5 (GHz), or 2.0 (GHz) for portable telephones, or can be near 2.4 (GHz) for Bluetooth as well.

Further, while the data processing terminal 40 of the foregoing embodiment has illustrated that single point-shaped resistive connecting means 41 is positioned near the center of the edge of child board 15 distal from connector 14, a plurality of such resistive connecting means 41, for example, may be provided.

Figure 11:
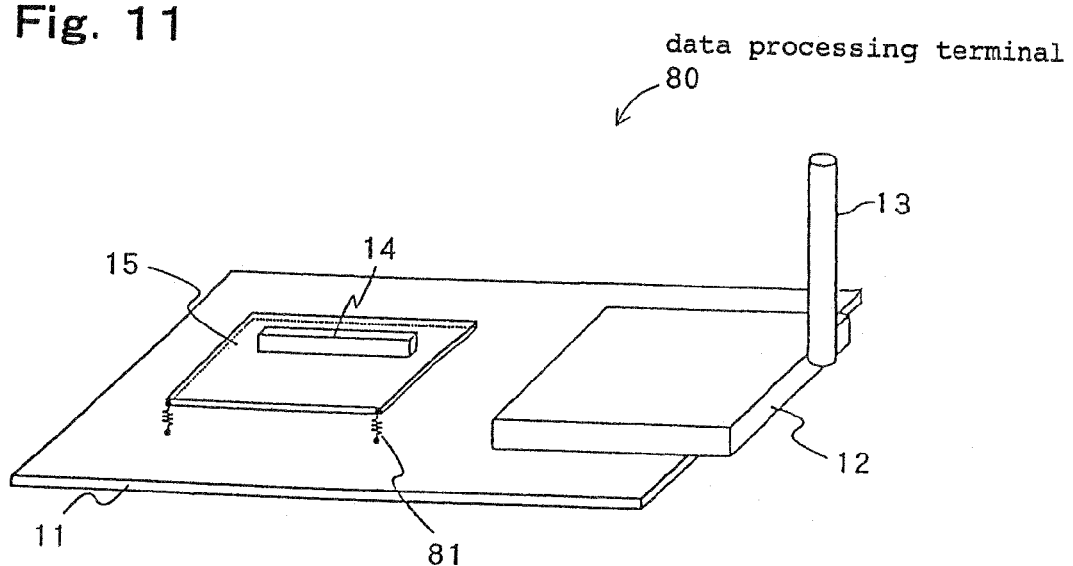
FIG. 11 is a perspective view illustrating the internal structure of a first exemplary modification to the data processing terminal.
Figure 12:
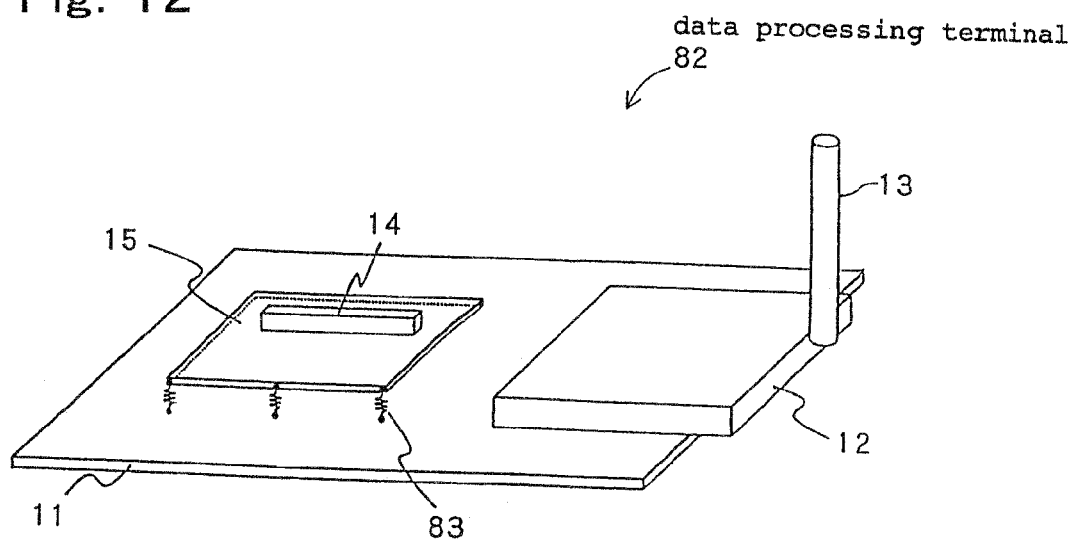
FIG. 12 is a perspective view illustrating the internal structure of a second exemplary modification to the data processing terminal.

For example, in data processing terminal 80 illustrated in FIG. 11 as a first exemplary modification to the foregoing embodiment, two resistive connecting means 81 are positioned one by one at corners of rectangular child board 15 at both ends of one side thereof, and in data processing terminal 82 illustrated in FIG. 12 as a second exemplary modification, three resistive connecting means 83 are positioned, each at corners of rectangular child board 15 at both ends and the center of one side thereof.

In these modifications, since total resistance value "R" of a plurality of resistive connecting means 81 or 83 also satisfies "R=120×π×h/w (Ω)", resistance value "Rn" of each of two resistive connecting means 81 satisfies "Rn=240×π×h/w (Ω)", while resistance value "Rn" of each of three resistive connecting means 83 satisfies "Rn=360×π×h/w (Ω)".

In this way, as first and second ground planes 17, 18 are connected in parallel with each other through a plurality of resistive connecting means 81, 83, parasitic inductance existing in series with resistive connecting means 81, 83 is reduced so that the ground structure can be terminated in a impedance matched state over a wide band, thereby making it possible to prevent the generation of a strong electromagnetic field, which impedes radio communications, over a wide band.

Figure 13:
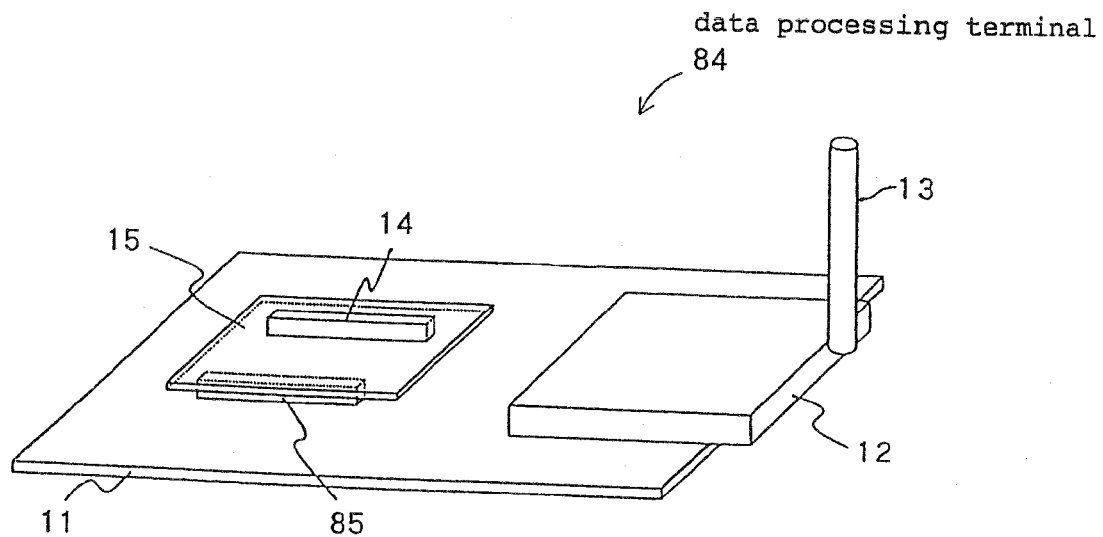
FIG. 13 is a perspective view illustrating the internal structure of a third exemplary modification to the data processing terminal.

Further, in data processing terminal 84 illustrated in FIG. 13 as a third exemplary modification, resistive connecting means 85 comprises an elongated metal member which has the overall length equivalent to one side of child board 15, and this single resistive connecting means 85 is disposed in parallel with one side of child board 15. As one overall side of second ground plane 18 is connected to first ground plane 17 through elongated resistive connecting means 85, it is possible to minimize parasitic inductance existing in series with resistive connecting means 85.

Figure 14A:
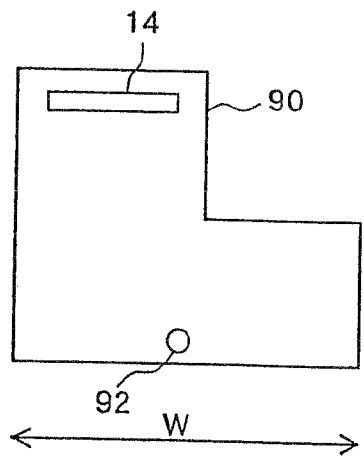
FIG. 14A is a top plan view illustrating a main portion of a fourth exemplary modification to the data processing terminal.
Figure 14B:
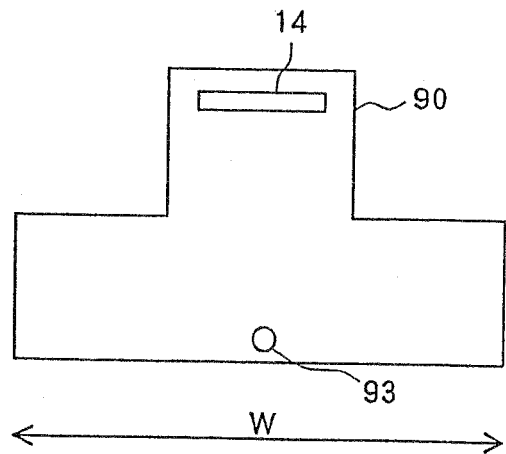
FIG. 14B is a top plan view illustrating a main portion of a fifth exemplary modification to the data processing terminal.

Also, while the foregoing embodiment has illustrated that child substrate 15 and second ground plane 18 are formed in simple rectangular shape, second ground plane 90 may be formed in L-shape, as illustrated in FIG. 14A as a fourth exemplary modification, or second ground plane 91 may be formed in T-shape, as illustrated in FIG. 14B as a fifth exemplary modification.

Even in such modifications, resistive connecting means 92, 93 may be positioned near an edge of second ground plane 90, 91 in different shape, distal from connector 14, such that the resistance value thereof satisfies "$R=120 \times \pi \times h/w$ ($\Omega$)" for length "w" of the edge.

Figure 15A:
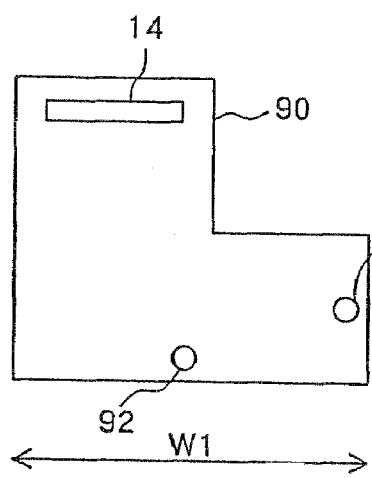
FIG. 15A is a top plan view illustrating a main portion of a sixth exemplary modification to the data processing terminal.
Figure 15B:
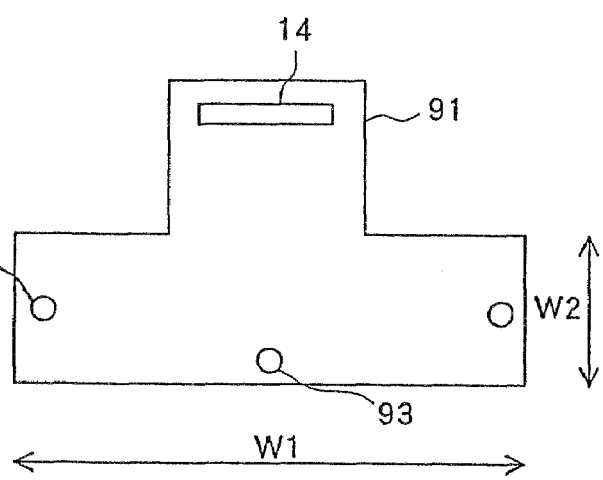
FIG. 15B is a top plan view illustrating a main portion of a seventh exemplary modification to the data processing terminal.

However, if second ground planes 90, 91 are formed in L-shape and T-shape as mentioned above, there is a concern that the portion extending outward on a lateral side(s) in the figure can act as an open end(s). Therefore, if this can cause a problem, resistive connecting means 94, 95 are preferably disposed in the laterally extending portions, as illustrated in FIGS. 15A and 15B as a sixth and a seventh exemplary modification.

Even in such configurations, however, resistive connecting means 92-95 are only required to satisfy the resistance value calculated by "$R=120 \times \pi \times h/w$ ($\Omega$)" for lengths "w" of the respective edges near which they are disposed. Therefore, for example, when resistive connecting means 92, 94 are disposed near the edges having different lengths "w1, w2" in L-shaped second ground plane 90, resistive connecting means 92, 94 also have different resistance values as calculated by "$R1=120 \times \pi \times h/w1$ ($\Omega$)" and "$R2=120 \times \pi \times h/w2$ ($\Omega$)", respectively. This also applies to T-shaped second ground plane 91.

Figure 16:
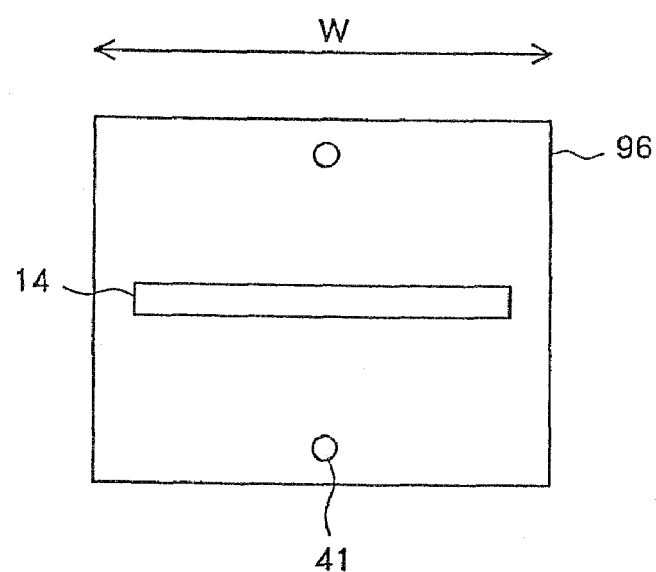
FIG. 16 is a top plan view illustrating a main portion of an eighth exemplary modification to the data processing terminal.

Further, while data processing terminal 40 and the like in the foregoing embodiment have illustrated that connector 14 is disposed along an edge of second ground plane 18, connector 14 can be disposed in a central portion of second ground plane 96, as illustrated in FIG. 16.

In this modification, since this structure is equivalent to a structure which comprises a pair of an integrally joined second ground planes 18, each having connector 14 disposed along one edge, two resistive connecting means 41 are preferably disposed one by one near each of edges of second ground planes 96 positioned on both sides of connector 14.

Figure 2:
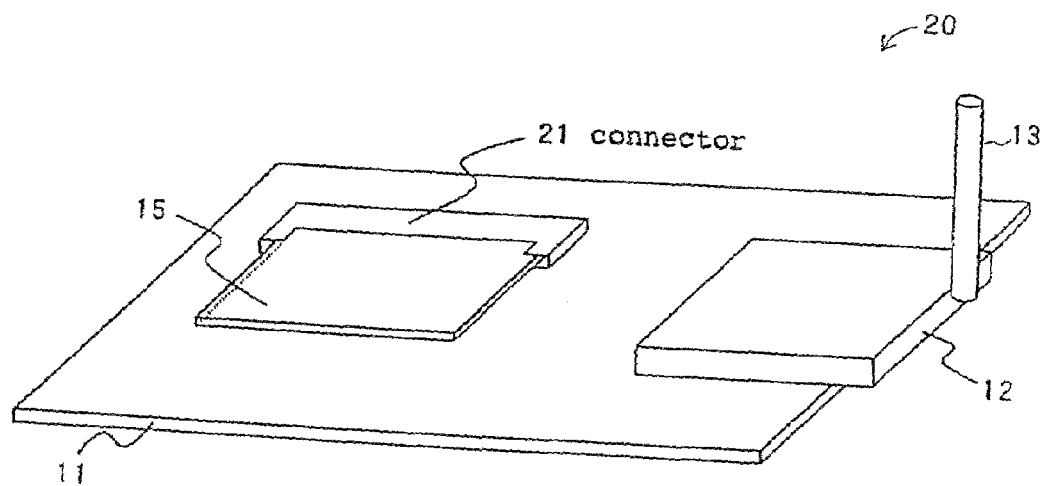
FIG. 2 is a perspective view illustrating the internal structure of a second exemplary conventional data processing terminal.
Figure 3:
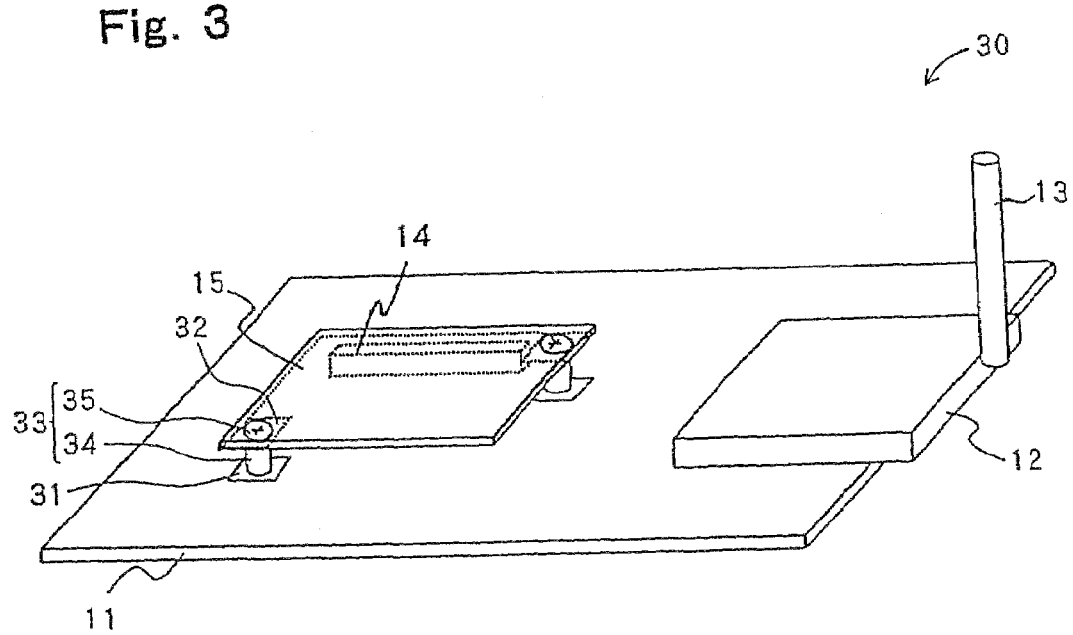
FIG. 3 is a perspective view illustrating the internal structure of a third exemplary conventional data processing terminal.
Figure 4:
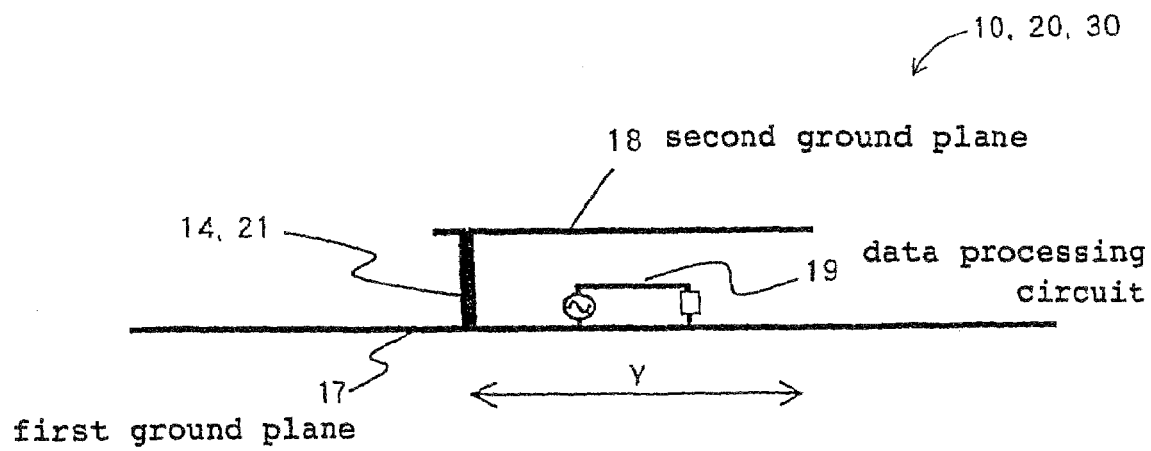
FIG. 4 is a schematic diagram illustrating electric features such as a first ground plane, a second ground plane, and the like in the first exemplary conventional data processing terminal.
Figure 5A:
FIG. 5A is a schematic diagram illustrating the structure of an inverted L-shaped antenna.
Figure 5B:
FIG. 5B is a schematic diagram illustrating the structure of an inverted F-shaped antenna.

Also, while data processing terminal 40 and the like in the foregoing embodiment have illustrated that the connector is comprised of a pair of vertically removable connectors 14, the connector can be comprised of connector 21 to which one edge of child board 15 is mounted and removed in the transverse direction, as is the case with data processing terminal 20 illustrated in FIG. 2.

Further, in data processing terminals 40, 80, 82 in the foregoing embodiments, each of resistive connecting means 41, 81, 83 is presumably comprised of a tubular metal column and a screw, while in data processing terminal 84, resistive connecting means 85 is illustratively comprised of an elongated metal member. However, it is not easy to realize a predetermined resistance value with resistive connecting means 41 and the like in such structures.

Figure 17:
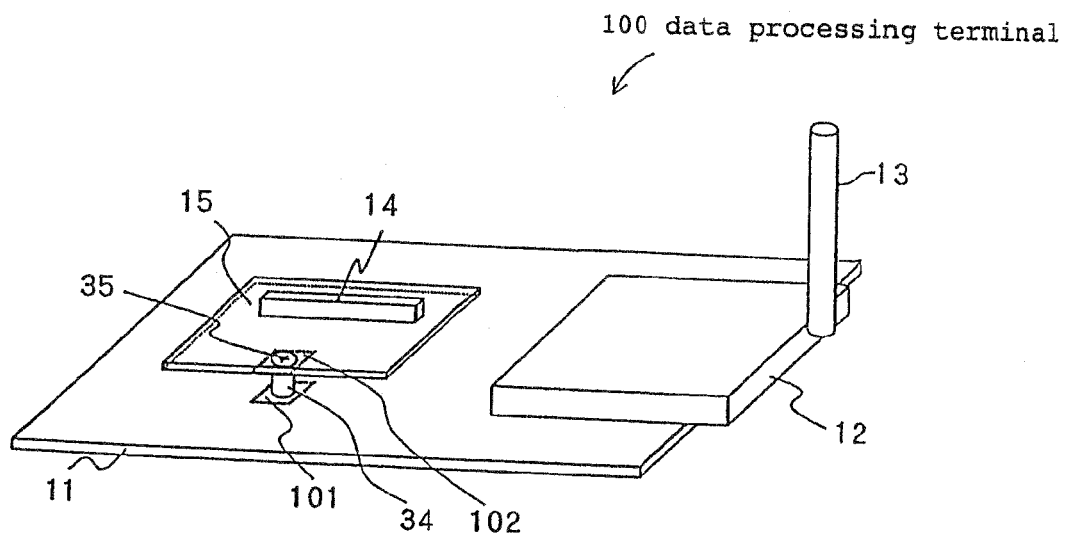
FIG. 17 is a perspective view illustrating the internal structure of a data processing terminal according to a second embodiment of the present invention.

Now, data processing terminal 100 which solves the foregoing problems will be described below with reference to FIGS. 17 and 18 as a second embodiment of the present invention. First, as illustrated in FIG. 17, data processing terminal 100 of this embodiment has connection pad 101 formed on the top surface of parent board 11, wherein this connection pad 101 is electrically continuous to first ground plane 17.

Figure 18:
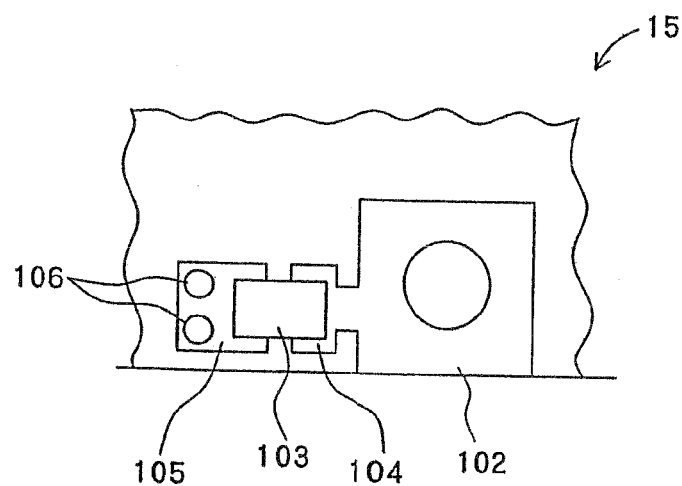
FIG. 18 is a bottom view illustrating a main portion of a child board.

Connection pad 102 is also formed on the bottom surface of child substrate 15, and is electrically continuous to connection pad 101 of parent substrate 11 through conductive metal column 34 and screw 35, However, as illustrated in FIG. 18, resistor 103, which is resistive connecting means, is mounted on the bottom surface of child board 15, such that connection pad 102 of child board 15 is electrically continuous to second ground plane 18 through resistor 103.

More specifically, a pair of mounting pads 104, 105 are formed on the bottom surface of child board 15, and one mounting pad 104 is formed integrally with connection pad 102. The other mounting pad 105 is electrically continuous to second ground plane 18 through viahole 106, and resistor 103 has both ends connected to the pair of mounting pads 104, 105.

In such a configuration, in data processing terminal 100 of this embodiment, resistor 103, which is the resistive connecting means, is mounted only on child board 15, so that parent board 11 may be in the same structure as before. For this reason, when data processing terminal 100 which is mounted only with parent board 11 but not with child board 15 is sold as a product such that a customer adds optional child board 15 to data processing terminal 10 as desired, resistor 103 may be mounted only on child board 15 for preventing the problem caused by the addition.

Therefore, useless measures need not be taken to initial data processing terminal 100 which does not contain child board 15, thus making it possible to improve the productivity through simplification of the structure of data processing terminal 100 in the initial state. Also, even when child board 15 is initially mounted in data processing terminal 100, data processing terminals 100 are produced in volume with a high productivity because no modification is required in the design of parent board 15 when child board 15 is changed in size and shape.

It should be noted that the present invention is not either limited to the foregoing embodiment, but contemplates a variety of modifications without departing from the gist thereof. For example, while the foregoing embodiment has illustrated that resistor 103, which serves as the resistive connecting means, is mounted only on child board 15, resistor 13 may be mounted only on parent board 11.

In this case, child board 15 may be in the same structure as before, so that even if a plurality of types of child boards 15, for example, are made exchangeable, resistor 103 need not be mounted on each of them, thus improving the productivity of the plurality of types of child boards 15. Alternatively, two resistors can be mounted one on parent board 11 and one on child board 15, in which case each of the resistors can have one half of the resistance value.

Now, the result of experiments made by the inventors will be described below with reference to FIGS. 19A, 19B and 20.

The inventors installed an existing software application for an electromagnetic simulation based on an FDTD (Finite Differential Time Domain) method into a general personal computer to calculate the frequency characteristics of distant radiation electric field strengths of the aforementioned data processing terminals 10, 30, 40, 82. It can be readily supposed that though the distant radiation electric field strength is not the same as electromagnetic interference due to an electromagnetic field near a terminal, a higher distant radiation electric field strength causes higher susceptibility to the electromagnetic interference in the neighborhood.

FIGS. 19A and 19B illustrate an electromagnetic field simulation model. First ground plane 17 was modeled by a complete conductor having a width dimension of 160 (mm), a length dimension of 70 (mm), and an infinitely small thickness, while second ground plane 18 was modeled by a complete conductor having a width dimension of 40 (mm), a length dimension of 50 (mm), and an infinitely small thickness. Further, connector 14 was modeled by a complete conductor having a width dimension of 20 (mm), an infinitely small length dimension, and a thickness of 4 (mm), and was disposed along one longer side of second ground plane 18.

Data processing circuit 19 was composed of a signal wire, a resistor, and a voltage source. The signal wire was modeled by a rod-shaped complete conductor having infinitely small width and thickness dimensions and a length dimension of 5 (mm), and disposed at height of 2 (mm) from first ground plane 17. A 1-ohm resistor was inserted between one end of the signal wire and first ground plane 17, while a rod-like complete conductor was inserted between the other end of the signal wire and first ground plane 17. The voltage source was disposed at the center of the signal wire in parallel with first ground plane 17. The voltage source was chosen to have an internal impedance of 0 ($\Omega$) and an output voltage of 1 (V).

Data processing circuit 19 was positioned on ground plane 17 beneath second ground plane 18 near the center thereof with its longitudinal direction orthogonal to connector 14. While data processing circuit 19 should essentially be mounted across the entirety of parent board 11, the foregoing model was created for showing that even a signal wire of as short as 5.0 (mm) would cause second ground plane 18 to resonate.

This simulation was performed to investigate two each of data processing terminals according to the prior art examples and the present invention. Prior Art Example 1 corresponds to data processing terminal 10 in which an open end is formed on the opposing edge distal from connector 14 which connects first ground plane 17 to second ground plane 18, and Prior Art Example 2 corresponds to data processing terminal 30 which have two ground planes 17, 18 connected through a complete conductor at A-point and D-point which are situated at diagonal positions of second ground plane 2.

Present Invention 1 corresponds to data processing terminal 40 which has two ground planes 17, 18 connected through resistive connecting means 41 at the center B of an edge, and Present invention 2 corresponds to data processing terminal 82 which has two ground planes 17, 18 connected through resistive connecting means 83 at three points A, B, C along an edge.

Since spacing h between two ground planes 17, 18 is 4 (mm), and length w of the edge of second ground plane 18 distal from connector 16 is 40 (mm), resistance value R of the resistive connecting means is calculated to be 37.7 ($\Omega$) from the equation "$R=120\times\pi\times h/w$ ($\Omega$)". Thus, in Present Invention 1, the resistance value of resistive connecting means 41 was chosen to be 37.7 ($\Omega$), while in Present Invention 2, resistance value of resistive connecting means 83 was chosen to be 113 ($\Omega$) which is the value three times as large as R.

The FDTD-based electromagnetic field simulation prepares a calculation region including a calculation model, and defines an absorption boundary region around the calculation region. Further, the calculation region is divided by a mesh. In this calculation, the prepared calculation region had a width dimension of 260 (mm), a length dimension of 170 (mm), and a height dimension of 100 (mm), and a calculation model was disposed at the center of the region. A 10-layer PML (Perfectly Matched Layer) absorption boundary condition was used for the absorption boundary condition. Further, the calculation region was divided by a uniform mesh at intervals of 5.0 (mm) in the horizontal and vertical directions and 2.0 (mm) in the thickness direction.

Under the foregoing conditions, the distant radiation electric field strength was calculated in a range of 1.0-3.0 (GHz). FIG. 20 shows the result of the calculation. The origin was defined at the center of first ground plane 17, and maximum distant radiation electric field strength values were plotted on an XY-plane, a YX-plane, and a ZX-plane. In the calculation model for Prior Art Example 1, the result was normalized based on the maximum distant radiation electric field strength when second ground plane 17 and connector 14 were removed.

In data processing terminal 10 of Prior Art Example 1, there is a peak near 1.4 (GHz). The distance from the position of connector 14 on second ground plane 18 to the other edge thereof is 45 (mm), and this length converts into the quarter wavelength at frequency of 1.7 (GHz). Assuming that the resonant frequency is more or less lower because of second ground plane 18 being in the shape of a wide conductor plate, it can be supposed that the peak is caused by the resonance of the ground structure which is formed of first ground plane 17, second ground plane 18, and connector 14 which connects both ground planes 17, 18.

In data processing terminal 20 of Prior Art Example 2, there is a peak near 2.2 (GHz). The distance from the position of connector 14 on second ground plane 18 to the other edge thereof converts into a half wavelength at frequency of 3.4 (GHz) which is largely different from the aforementioned peak frequency. However, assuming that the resonant frequency is more or less lower because of the asymmetrically positioned A-point at which both ground planes 17, 18 are short-circuited, and because of second ground plane 18 being in the shape of a wide conductor plate, as is the case with the foregoing, it can be supposed that this peak is also caused by the resonance of the ground structure which is formed of first ground plane 17, second ground plane 18, connector 14, and auxiliary connecting means 33 at A- and D-points.

While data processing terminal 30 of Prior Art Example 2 can increase the resonant frequency as compared with data processing terminal 10 of Prior Art Example 1, a strong electromagnetic field is still generated in frequency bands utilized for radio communications. For example, since PHS utilizes approximately 1.9 (GHz); portable telephones, about 2.0 (GHz); and wireless LAN and bluetooth, approximately 2.4 (GHz), data processing terminal 30 of Prior Art 2 is susceptible to impediments to these radio communications.

On the other hand, in data processing terminals 40, 82 of Present Invention 1, 2, the distant radiation electric field strength does not present a peak over a wide band of at least 1.0 to 3.0 (GHz), and this is equivalent to the absence of second ground plane 18 and connector 14 which are defined as the references. In addition, an increase in level with respect to the references is 2.0 (dB), which is very low as compared with Prior Art Examples 1, 2.

In the ground structure comprised of first ground plane 17, second ground plane 18, and connector 14, strong resonance caused by the ground structure can be limited over a wide band by adding a resistor having a resistance value identical to the characteristic impedance value of a transmission line formed of first and second ground planes 17, 18 to an edge of second ground plane 18 distal from connector 14.

As described above, the present invention provides the following advantages.

In a first data processing terminal according to the present invention, the resistive connecting means which generates a predetermined resistance value connects a position near the distal edge of the second ground plane opposite to the position of the connector to the first ground plane, so that the resistive connecting means can reduce Q of the resonance of the ground structure comprised of the first ground plane, the plurality of ground terminals, and the second ground plane, thereby making it possible to reduce the resonance of the ground structure caused by an electromagnetic field of the data processing circuit to prevent the generation of a strong electromagnetic field which impedes radio communications.

In another aspect of the present invention, the ground structure comprised of the first ground plane, the plurality of ground terminal, and the second ground plane has a characteristic impedance equivalent to the resistance value of the resistive connecting means, so that the ground structure can have the open end terminated in an impedance matched state, thereby preventing the resonance of the ground structure caused by an electromagnetic field of the data processing circuit to prevent without fail the generation of a strong electromagnetic field which impedes radio communications.

Also, the resistive connecting means has the resistance value "R" which satisfies:

$$[\alpha 1 \times 120 \times \pi \times h/w] = R < [\alpha 2 \times 120 \times \pi \times h/w] \ (\Omega)$$

where "w" represents the length of the edge of the second ground plane near which the resistive connecting means is positioned, "h" represents the spacing between the first ground plane and the second ground plane, and $\alpha 1$ and $\alpha 2$ are predetermined coefficients which satisfy "$\alpha 1 = 1 = \alpha 2$, so that the characteristic impedance of the ground structure can be made equivalent to the resistance value of the resistive connecting means.

Alternatively, the resistive connecting means has the resistance value "R" which satisfies:

$$R = 120 \times \pi \times h/w \ (\Omega)$$

so that the characteristic impedance of the ground structure can be made identical to the resistance value of the resistive connecting means.

Alternatively, the resistive connecting means comprises n resistive connecting means for connecting the first ground plane to the second ground plane in parallel, and each of the n resistive connecting means has a resistance value "R" which satisfies:

$$R = 120 \times \pi \times h/w \ (\Omega)$$

so that the resistance value of the plurality of resistive connecting means can be made identical to the characteristic impedance of the ground structure, and the characteristic impedance existing in series of each resistive connecting means can be reduced because there are a plurality of resistive connecting means, thus terminating the ground structure in an impedance matched state over a wide band.

Also, when one of the resistive connecting means connects a position near the center of the edge of the second ground plane to the first ground plane; or when two of the resistive connecting means connect positions near both ends of the edge of the second ground plane to the first ground plane, respectively; or when three of the resistive connecting means connect positions near the center and both ends of the edge of the second ground plane to the first ground plane, respectively, the second ground plane can be connected to the first ground plane by a predetermined number of resistive connecting means in a symmetric state.

Alternatively, the resistive connecting means is formed in an elongated shape having an overall length equivalent to the edge of the second ground plane, and is positioned substantially in parallel with the edge of the second ground plane, so that the entire edge of the second ground plane can be connected to the first ground plane by the single resistive connecting means.

The resistive connecting means comprises a resistor which is mounted on the parent board and connected to the first ground plane, and the resistor on the parent board is connected to the second ground plane on the child board through a conductor. Since the resistor required for the resistive connecting means is mounted on the parent board, the child board can be in the same structure as before.

Alternatively, the resistive connecting means comprises a resistor which is mounted on the child board and connected to the second ground plane, and the resistor on the child board is connected to the first ground board on the parent board through a conductor. Since the resistor required for the resistive connecting means is mounted on the child board, the parent board can be in the same structure as before.

Alternatively, the resistive connecting means comprises two resistors mounted on the parent board and child board, respectively, and connected to the first ground plane and second ground plane, respectively, and the resistors on the parent board and child board are connected to each other through a conductor. Since the resistive connecting means comprises two resistors, each resistive connecting means can have the resistance value reduced to one-half.

Also, a radio communication circuit is removably mounted for making radio communications with the outside, wherein the radio communication circuit is in wired communication with the data processing circuit; or a radio communication circuit is formed integrally with the data processing terminal for making radio communications with the outside, wherein the radio communication circuit is in wired communication with the data processing circuit, so that the ground structure will not generate an electromagnetic field, by the action of resonance, which impedes the radio communications of the radio communication circuit, thus permitting the radio communication circuit to satisfactorily make radio communications.

In a terminal designing method associated with a terminal designing apparatus, resistance calculating means calculates the resistance value "R" of the resistive connecting means for connecting a position near the distal edge of the second ground plane opposite to the position of the connector to the first ground plane in accordance with "$R = 120 \times \pi \times h/w \ (\Omega)$". Thus, the resistance value can be calculated for the resistive connecting means which terminates the open end of the ground structure in the data processing terminal in an impedance matched state.

The invention claimed is:

1. A data processing terminal comprising:
a first board including a first circuit;
a second board disposed substantially in parallel with said first board and including a second circuit;

a first ground plane disposed on said first board, and comprised of a conductor in a predetermined shape for determining a potential reference for said first board;

a second ground plane disposed on said second board, and comprised of a conductor in a predetermined shape for determining a potential reference for said second board;

a ground terminal for connecting a position near one end of an edge of said second ground plane to said first ground plane;

a signal terminal for communicating an electric signal between said first circuit and said second circuit;

a connector including said ground terminal and said signal terminal; and resistive connecting means for connecting a position near one end of the other edge of said second ground plane to said first ground plane, and having a predetermined resistance value R which satisfies:

$$(\alpha 1 \times 120 \times \pi \times h/w) \leq R < (\alpha 2 \times 120 \times \pi \times h/w) \ (\Omega)$$

where w represents a length of an edge of said second ground plane near which said resistive connecting means is positioned, h represents a spacing between said first ground plane and said second ground plane, and α1 and α2 are predetermined coefficients which satisfy $\alpha 1 \leq 1 < \alpha 2$.

2. The data processing terminal according to claim 1, wherein:

said first circuit comprises a data processing circuit; and said second circuit comprises a memory circuit for temporarily storing data processed by said data processing circuit.

3. The data processing terminal according to claim 1, wherein:

said resistive connecting means has the resistance value R which satisfies:

$$R = 120 \times \pi \times h/w \ (\Omega).$$

4. The data processing terminal according to claim 1, wherein the data processing terminal communicates with an outside in a frequency band near 1.9 GHz.

5. The data processing terminal according to claim 1, wherein the data processing terminal communicates with an outside in a frequency band near 800 MHz.

6. The data processing terminal according to claim 1, wherein the data processing terminal communicates with an outside in a frequency band near 1.5 GHz.

7. The data processing terminal according to claim 1, wherein the data processing terminal communicates with an outside in a frequency band near 2.0 GHz.

8. The data processing terminal according to claim 1, wherein the data processing terminal communicates with an outside in a frequency band near 2.4 GHz.

9. The data processing terminal according to claim 1, wherein h is 4 mm, w is 40 mm, and R is 37.7 Ω.

10. The data processing terminal according to claim 1, wherein the resistive connecting means reduces generation of an electromagnetic field that impedes radio communications.

* * * * *